US012597589B2

(12) United States Patent
Hirayama et al.

(10) Patent No.: US 12,597,589 B2
(45) Date of Patent: Apr. 7, 2026

(54) ELECTROSTATIC CHUCK

(71) Applicant: SUMITOMO OSAKA CEMENT CO., LTD., Tokyo (JP)

(72) Inventors: Masaki Hirayama, Tokyo (JP); Tetsuro Itagaki, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 647 days.

(21) Appl. No.: 17/999,830

(22) PCT Filed: May 27, 2021

(86) PCT No.: PCT/JP2021/020196
§ 371 (c)(1),
(2) Date: Nov. 23, 2022

(87) PCT Pub. No.: WO2022/004209
PCT Pub. Date: Jan. 6, 2022

(65) Prior Publication Data
US 2023/0290620 A1 Sep. 14, 2023

(30) Foreign Application Priority Data
Jun. 29, 2020 (JP) ................................. 2020-111805

(51) Int. Cl.
*H01J 37/32* (2006.01)

(52) U.S. Cl.
CPC .. *H01J 37/32697* (2013.01); *H01J 37/32174* (2013.01); *H01J 37/32642* (2013.01); *H01J 37/32715* (2013.01)

(58) Field of Classification Search
CPC .......... H01J 37/32697; H01J 37/32174; H01J 37/32642; H01J 37/32715; H01J 2237/332–3348
(Continued)

(56) References Cited

U.S. PATENT DOCUMENTS 3,902,077 A * 8/1975 Takemura ............ H03G 1/0052
327/308
5,436,614 A * 7/1995 Torikoshi ................. G01K 7/25
340/595
(Continued)

FOREIGN PATENT DOCUMENTS

JP 2012-134375 A 7/2012
JP 2013-141024 A 7/2013
(Continued)

OTHER PUBLICATIONS

Office Action issued in Japanese Patent Application No. 2022-533744 (Jan. 21, 2025).
(Continued)

*Primary Examiner* — Charlee J. C. Bennett
(74) *Attorney, Agent, or Firm* — Merchant & Gould P.C.

(57) ABSTRACT

Provided is an electrostatic chuck device including: an electrostatic chuck plate which has a dielectric substrate having a placement surface on which a wafer is placed and electrodes positioned in the dielectric substrate; a focus ring which is installed on an outer peripheral portion of the electrostatic chuck plate and surrounding the placement surface; and a power connection portion which connects the electrode and a power supply. The electrostatic chuck plate has a first electrode positioned in a region overlapping the placement surface in plan view and a second electrode positioned in a region overlapping the focus ring in plan view. The power connection portion includes a power wire electrically connecting the first electrode and the second electrode via a current regulator.

13 Claims, 3 Drawing Sheets

(58) Field of Classification Search
USPC ..... 156/345.51, 345.1–345.55; 118/715–733
See application file for complete search history.

(56) References Cited

U.S. PATENT DOCUMENTS

| | | | | |
|---|---|---|---|---|
| 12,243,723 | B2 * | 3/2025 | Hayasaka ......... | H01J 37/32715 |
| 2008/0308410 | A1 * | 12/2008 | Teschner ............. | H01J 37/3444 |
| | | | | 204/192.12 |
| 2010/0127764 | A1 * | 5/2010 | Suzuki ................. | H02M 3/073 |
| | | | | 327/541 |
| 2018/0063918 | A1 * | 3/2018 | Nakamura ............. | H05B 45/48 |
| 2019/0088452 | A1 * | 3/2019 | Yamada ............ | H01J 37/32678 |
| 2019/0088520 | A1 * | 3/2019 | Kraus ............... | H01J 37/32568 |
| 2020/0219701 | A1 * | 7/2020 | Koshimizu ....... | H01J 37/32183 |
| 2020/0251313 | A1 | 8/2020 | Rogers et al. | |
| 2021/0398778 | A1 * | 12/2021 | Kim ................. | H01J 37/32082 |

FOREIGN PATENT DOCUMENTS

| | | | |
|---|---|---|---|
| JP | 2016-122740 | A | 7/2016 |
| JP | 2021-044540 | A | 3/2021 |
| WO | 2020/008928 | A1 | 1/2020 |

OTHER PUBLICATIONS

International Search Report for PCT/JP2021/020196 (Aug. 3, 2021).

\* cited by examiner

300

IN

301

302

303

OUT

400

IN

401

404

402

405

403

OUT

410

411

412

ELECTROSTATIC CHUCK

TECHNICAL FIELD

The present invention relates to an electrostatic chuck device.

This application is a National Stage Application of PCT/JP2021/020196, filed on May 27, 2021, which claims benefit of priority to Japanese Patent Application No. 2020-111805, filed in Japan on Jun. 29, 2020, the content of which is incorporated herein by reference. To the extent appropriate, a claim of priority is made to each of the above disclosed applications.

BACKGROUND ART

As an electrostatic chuck device supporting a semiconductor wafer, there is known a configuration in which an electrostatic chuck capable of focus ring adsorption is installed on a metallic susceptor as described in, for example, Patent Literature 1. A power supply device for plasma generation is connected to the susceptor.

CITATION LIST

Patent Literature

Patent Literature No. 1: Japanese Laid-open Patent Publication No. 2012-134375

SUMMARY OF INVENTION

Technical Problem

In the electrostatic chuck device, in a case where there is a focus ring around the wafer, the thickness of the focus ring decreases as the time of use increases. As the thickness of the focus ring decreases, the capacity between plasma and an electrode changes and the plasma becomes non-uniform. Accordingly, there is a problem such as an increase in etching rate difference between the center and outer peripheral portions of the wafer and an increase in focus ring wear rate.

An object of the present invention is to provide an electrostatic chuck device capable of plasma control around a focus ring.

Solution to Problem

Provided according to a first aspect of the present invention is an electrostatic chuck device including: an electrostatic chuck plate which has a dielectric substrate having a placement surface on which a wafer is placed and electrodes which are positioned in the dielectric substrate; a focus ring which is installed on an outer peripheral portion of the electrostatic chuck plate and surrounding the placement surface; and a power connection portion which connects the electrode and a power supply. The electrostatic chuck plate has a first electrode which is positioned in a region overlapping the placement surface in plan view and a second electrode which is positioned in a region overlapping the focus ring in plan view. The power connection portion includes a power wire which electrically connects the first electrode and the second electrode via a current regulator.

The electrostatic chuck device of the first aspect of the present invention preferably includes the features described below. It is also preferable to combine two or more of the following features as necessary.

The electrostatic chuck device may further include a side cover which surrounds the electrostatic chuck plate from an outside in a radial direction, and the current regulator may be positioned on a back surface side of the dielectric substrate and inside the side cover.

The current regulator may include a variable resistor.

The current regulator may include a constant current circuit.

The second electrode may be divided into a plurality of electrode portions which are arranged along a direction in which the focus ring extends, and each of the electrode portions may be connected to the first electrode via the power wire.

The electrostatic chuck device may further include a metal base which supports the electrostatic chuck plate from a back surface side opposite to the placement surface, and the current regulator may be positioned on a side of the metal base opposite to the electrostatic chuck plate and inside the side cover.

Advantageous Effects of Invention

According to one aspect of the present invention, it is possible to provide an electrostatic chuck device capable of plasma control around a focus ring.

DESCRIPTION OF EMBODIMENTS

Figure 1:
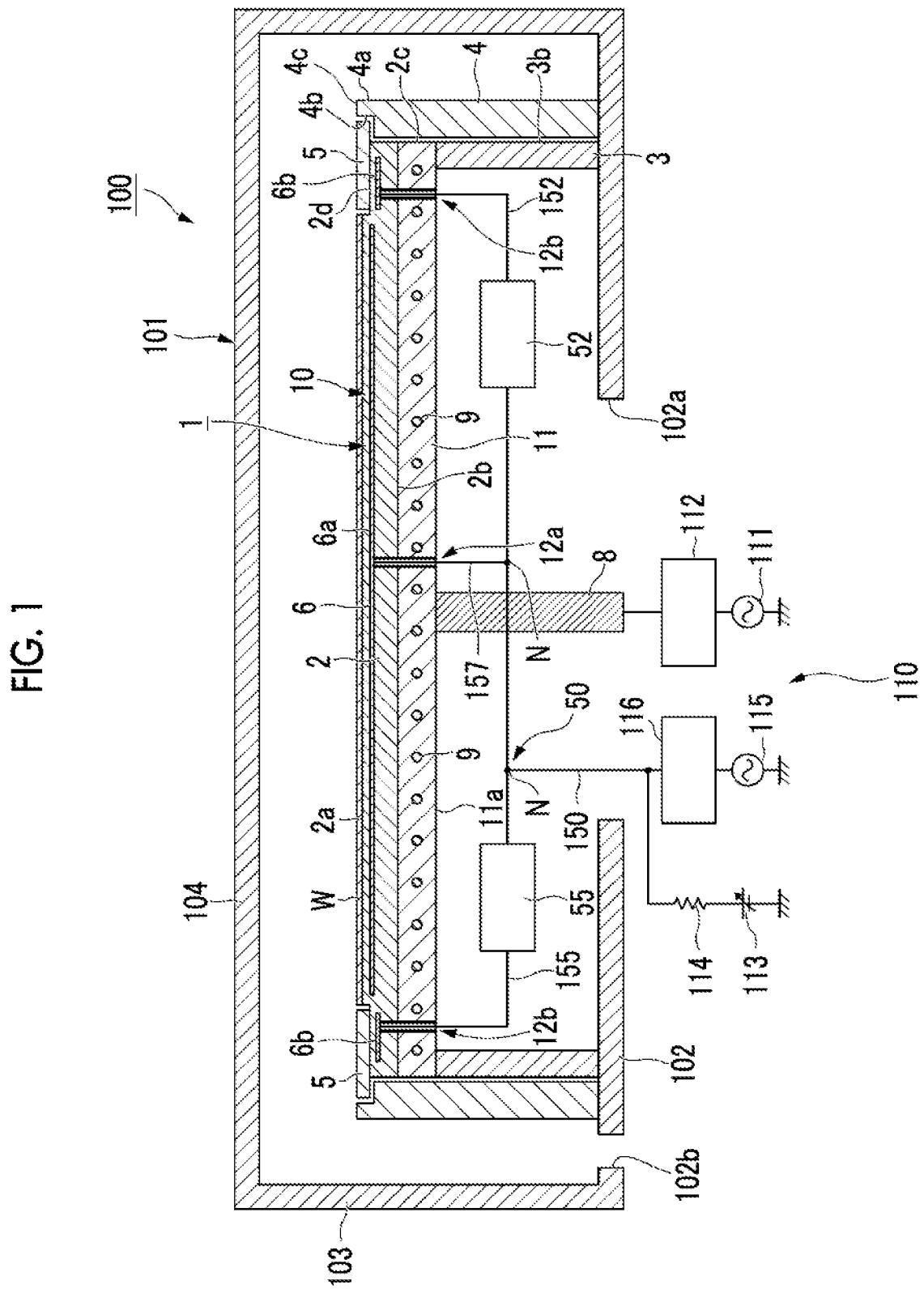
FIG. 1 is a schematic cross-sectional view illustrating a preferred example of a plasma treatment apparatus provided with an electrostatic chuck device of an embodiment.

Preferred examples of each embodiment of the electrostatic chuck device of the present invention will be described below with reference to the drawings. It should be noted that in each of the drawings, the dimensions, proportions, and the like of components may be changed as appropriate so that the drawing is easy to see. Numbers, positions, sizes, members, and so on can be, for example, omitted, added, changed, replaced, and exchanged without departing from the spirit of the present invention.

Figure 2:
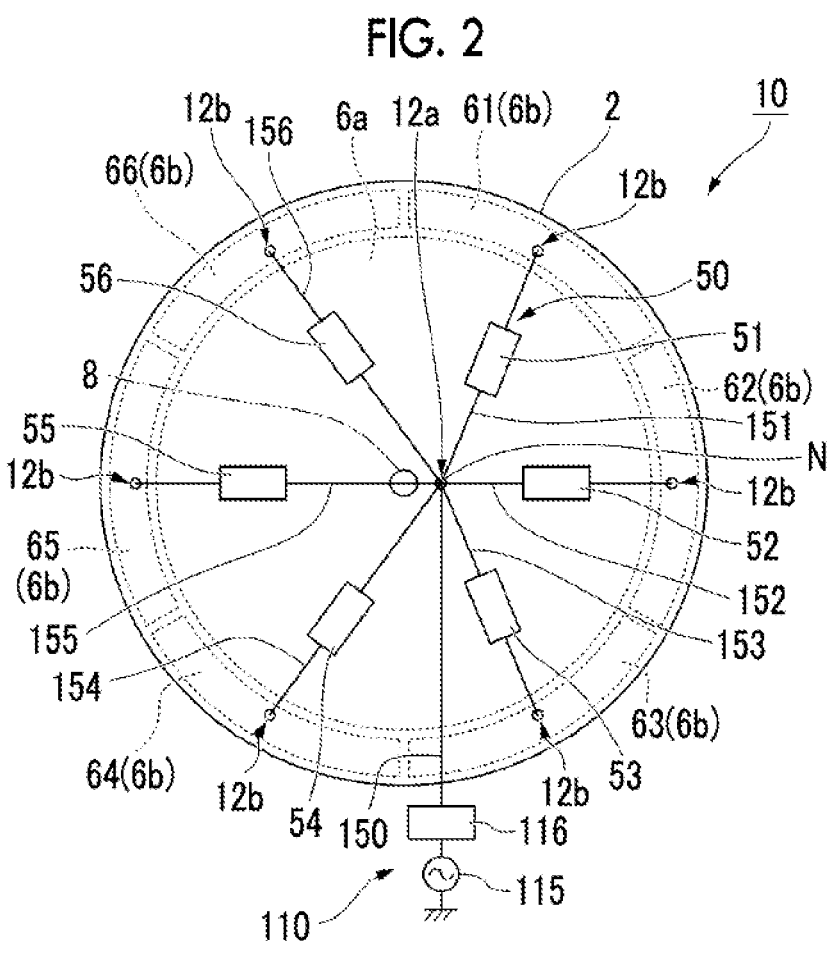
FIG. 2 is a schematic plan view of an electrostatic chuck plate viewed from the back side.

FIG. 1 is a schematic cross-sectional view of a plasma treatment apparatus provided with the electrostatic chuck device of the present embodiment. FIG. 2 is a plan view of an electrostatic chuck plate viewed from the back side.

A plasma treatment apparatus 100 includes a vacuum vessel 101 and an electrostatic chuck device 1 fixed in the vacuum vessel 101. The vacuum vessel 101 has a bottom wall 102, a tubular side wall 103 extending upward from the outer peripheral end of the bottom wall 102, and a top wall 104 fixed to the upper end of the side wall 103 and facing the bottom wall 102 in the up-down direction.

The electrostatic chuck device 1 is fixed to the bottom portion of the internal space of the vacuum vessel 101. The electrostatic chuck device 1 is fixed to the inside surface of the bottom wall 102 (upper surface in the drawing). The electrostatic chuck device 1 of the present embodiment is disposed in the vacuum vessel 101 with a placement surface 2a where a wafer W is placed facing upward. The form of disposition of the electrostatic chuck device 1 is an example, and the electrostatic chuck device 1 may be disposed in another form.

The bottom wall 102 of the vacuum vessel 101 has an opening portion 102a penetrating the bottom wall 102 in the thickness direction and an exhaust port 102b. The electrostatic chuck device 1 blocks the opening portion 102a from the inside of the vacuum vessel 101 (upper side in the drawing). The exhaust port 102b is positioned beside the electrostatic chuck device 1. A vacuum pump (not illustrated) is connected to the exhaust port 102b.

The electrostatic chuck device 1 includes an electrostatic chuck plate 10 adsorbing and supporting the wafer W and a metal base 11 supporting the electrostatic chuck plate 10. A focus ring 5 surrounding the placement surface 2a (wafer W) in plan view is disposed on the outer peripheral portion of the upper surface of the electrostatic chuck plate 10.

The electrostatic chuck plate 10 has a dielectric substrate 2 having the placement surface 2a where the wafer W is placed and an adsorption electrode 6 positioned in the dielectric substrate 2.

The dielectric substrate 2 is circular in plan view. The dielectric substrate 2 is made of a composite sintered body having mechanical strength and durability against a corrosive gas and the plasma thereof. Ceramics having mechanical strength and durability against a corrosive gas and the plasma thereof is preferably used as the dielectric material configuring the dielectric substrate 2. An aluminum oxide ($Al_2O_3$) sintered body, an aluminum nitride (AlN) sintered body, an aluminum oxide ($Al_2O_3$)-silicon carbide (SiC) composite sintered body, and so on are preferably used as the ceramics configuring the dielectric substrate 2.

The upper surface of the dielectric substrate 2 is the placement surface 2a where the wafer W is placed. A plurality of protrusion portions (not illustrated) are formed at predetermined intervals on the placement surface 2a. Each of the plurality of protrusion portions has a diameter smaller than the thickness of the wafer W. The plurality of protrusion portions of the placement surface 2a support the wafer W. Any shape can be selected as the shape of the protrusion portion, and examples thereof include a columnar shape.

The electrostatic chuck plate 10 has a ring adsorption region 2d radially outside the placement surface 2a of the dielectric substrate 2. In the case of the present embodiment, the upper surface of the ring adsorption region 2d is positioned lower than the placement surface 2a in the up-down direction in the drawing. The focus ring 5 is disposed on the ring adsorption region 2d. As illustrated in FIG. 1, the outer peripheral portion of the focus ring 5 disposed in the ring adsorption region 2d protrudes radially outward beyond the dielectric substrate 2. The outer peripheral portion of the focus ring 5 protruding outward from the dielectric substrate 2 is disposed in a notch portion 4b of a side cover 4, which will be described later. The height position of the upper surface of the focus ring 5 (position in the up-down direction) substantially matches the height position of the upper surface of the wafer W placed on the placement surface 2a.

The focus ring 5 is formed of, for example, a material equivalent in electrical conductivity to the wafer W placed on the placement surface 2a. Specifically, silicon, silicon carbide, quartz, alumina, or the like can be used as the constituent material of the focus ring 5. By disposing the focus ring 5, it is possible to make the plasma-related electrical environment substantially match the wafer W in the peripheral edge portion of the wafer W. As a result, no difference or unevenness in plasma treatment is likely to occur between the middle and peripheral edge portions of the wafer W.

The adsorption electrode 6 is positioned in the dielectric substrate 2. The adsorption electrode 6 includes a first electrode 6a positioned in a region overlapping the placement surface in plan view and a second electrode 6b positioned in a region overlapping the focus ring 5 in plan view. In other words, the electrostatic chuck plate 10 has the first electrode 6a and the second electrode 6b.

The first electrode 6a has a circular shape in plan view as illustrated in FIG. 2. The first electrode 6a is slightly smaller in diameter than the placement surface 2a and the wafer W. The first electrode 6a may be divided into a plurality of electrode portions. The plurality of electrode portions may be disposed side by side in the radial direction of the dielectric substrate 2, may be disposed side by side in the circumferential direction of the dielectric substrate 2, or may be disposed side by side in both the radial direction and the circumferential direction of the dielectric substrate 2.

As illustrated in FIG. 2, the second electrode 6b has a circular ring shape extending along the outer peripheral portion of the dielectric substrate 2. The second electrode 6b includes six electrode portions 61 to 66 arranged in the circumferential direction of the dielectric substrate 2. The six electrode portions 61 to 66 have the same size and shape and are arranged at equal intervals along the outer peripheral edge of the first electrode 6a. The second electrode 6b is disposed in a region overlapping the ring adsorption region 2d and causes the focus ring 5 to be adsorbed.

The form of division of the second electrode 6b is not limited to the example illustrated in FIG. 2. The second electrode 6b may be divided into a plurality of circular ring-shaped electrode portions. Alternatively, the six electrode portions 61 to 66 may be further divided in the radial direction.

As illustrated in FIG. 1, the height position of the second electrode 6b (position in the up-down direction) is lower than the height position of the first electrode 6a. In the case of the present embodiment, the focus ring 5 is larger in thickness than the wafer W. The step between the placement surface 2a of the dielectric substrate 2 and the ring adsorption region 2d has a height corresponding to the difference in thickness between the focus ring 5 and the wafer W. By adjusting the height positions of the first electrode 6a and the second electrode 6b, each of the adsorption force between the first electrode 6a and the wafer W and the adsorption force between the second electrode 6b and the focus ring 5 can be adjusted within an appropriate range.

The dielectric substrate 2 is bonded to the upper surface of the metal base 11 on a back surface 2b.

The metal base 11 is a disk-shaped metal member in plan view. The metal base 11 is made of, for example, an aluminum alloy. The metal base 11 supports the electrostatic chuck plate 10 from the back surface 2b side. The metal base 11 is supported from below by a tubular support member 3 extending downward from the outer peripheral portion of the back surface of the metal base 11. The tubular side cover 4 surrounding the electrostatic chuck plate 10, the metal base 11, and the support member 3 is disposed outside the electrostatic chuck plate 10, the metal base 11, and the support member 3 in the radial direction.

The metal base 11 has a heater element 9 stretched inside. The heater element 9 and the metal base 11 are insulated from each other. A heater power supply device (not illustrated) is connected to the heater element 9. The heater element 9 may be provided outside the metal base 11. The heater element 9 may be disposed in the electrostatic chuck plate 10. The heater element 9 may be disposed between the electrostatic chuck plate 10 and the metal base 11.

The support member 3 has a cylindrical shape extending from the outer peripheral end of the lower surface of the metal base 11 toward the bottom wall 102. The support member 3 is a member made of an insulating material such as alumina. The lower end portion of the support member 3 is fixed to the upper surface of the bottom wall 102. The support member 3 is disposed along the peripheral edge of the opening portion 102a of the bottom wall 102. The space between the support member 3 and the bottom wall 102 is hermetically sealed by, for example, an O-ring.

The space inside the support member 3 is connected to the space outside the vacuum vessel 101 via the opening portion 102a of the bottom wall 102. The back surface 2b of the dielectric substrate 2 is exposed to the space inside the support member 3. A worker can access the back surface 2b of the dielectric substrate 2 through the opening portion 102a of the bottom wall 102.

The side cover 4 is a cylindrical member extending in the up-down direction. The side cover 4 covers the outside of the support member 3. In the case of the present embodiment, the side cover 4 faces a side end surface 2c of the dielectric substrate 2 and an outer peripheral surface 3b of the support member 3 in the radial direction. The side cover 4 protects the side end surface 2c of the dielectric substrate 2 and the outer peripheral surface 3b of the support member 3 from plasma. The side cover 4 is made of, for example, alumina, quartz, or the like. The material of the side cover 4 is not particularly limited insofar as the material has required plasma resistance. The electrostatic chuck device 1 can also be configured without the side cover 4.

An upper end portion 4a of the side cover 4 is positioned beside the dielectric substrate 2. The side cover 4 has the notch portion 4b extending along the inner peripheral edge in the corner portion on the inner peripheral side of the upper end portion 4a. The outer peripheral portion of the focus ring 5 is disposed inside the notch portion 4b. The height position of an upper end surface 4c of the side cover 4 (position in the up-down direction in the drawing) substantially matches the height position of the upper surface of the focus ring 5 and the height position of the upper surface of the wafer W.

In the electrostatic chuck device 1, the electrostatic chuck plate 10 and the metal base 11 have a power connection hole 12a and a plurality of power connection holes 12b opening to a lower surface 11a of the metal base 11. The power connection hole 12a is positioned in the middle portion of the metal base 11 in plan view. The power connection hole 12a extends upward from the lower surface 11a and reaches the lower surface of the first electrode 6a.

The plurality of power connection holes 12b are provided at six locations respectively corresponding to the six electrode portions 61 to 66. The power connection holes 12b extend upward from the lower surface 11a of the metal base 11 and respectively reach the lower surfaces of the electrode portions 61 to 66. In the case of the present embodiment, the six power connection holes 12b are disposed at equal intervals in the circumferential direction of the electrostatic chuck plate 10.

Cylindrical insulating tubes (not illustrated) are embedded in the power connection holes 12a and 12b. The insulating tube is made of, for example, alumina. Power wires 151 to 157 of a power connection portion 50, which will be described later, are inserted inside the insulating tubes and connected to the first electrodes 6a and 6b in the bottom portions (upper ends) of the power connection holes 12a and 12b. The power wires 151 to 157 are connected to the first electrode 6a and the second electrode 6b by, for example, soldering or welding. The power wires 151 to 157, the first electrode 6a, and the second electrode 6b may be connected via connectors.

As illustrated in FIG. 1, a power supply device 110 includes a high-frequency power supply 111 for plasma excitation, a matching box 112, a DC power supply 113 for electrostatic adsorption, a resistor 114, a high-frequency power supply 115 for substrate bias, and a matching box 116.

The high-frequency power supply 111 for plasma excitation is electrically connected via the matching box 112 to a main power supply rod 8 extending downward from the lower surface of the metal base 11. The main power supply rod 8 is a metallic rod-shaped member made of, for example, aluminum, copper, stainless steel, or the like. The upper end of the main power supply rod 8 is fixed to the lower surface of the metal base 11. High-frequency power output from the high-frequency power supply 111 is supplied to the metal base 11 via the main power supply rod 8.

The DC power supply 113 for electrostatic adsorption is connected to a power wire 150 via the resistor 114. The high-frequency power supply 115 for substrate bias is connected to the power wire 150 via the matching box 116.

As illustrated in FIGS. 1 and 2, the electrostatic chuck device 1 has the power connection portion 50 connecting the power supply device 110 and the adsorption electrode 6. The power connection portion 50 has the eight power wires 150 to 157 and six current regulators 51 to 56. The power connection portion 50 is connected to the power supply device 110 via the power wire 150. In the case of the present embodiment, the power wire 150 is electrically connected to the DC power supply 113 for electrostatic adsorption and the high-frequency power supply 115 for substrate bias in the power supply device 110.

The power wire 150 is electrically connected at a node N to the seven power wires 151 to 157. It should be noted that in the illustration of FIG. 1, the node N is divided into two for convenience. As illustrated in FIG. 2, the six power wires 151 to 156 radially extend from the node N toward the outer peripheral portion of the electrostatic chuck plate 10. As illustrated in FIG. 1, the power wire 157 is inserted from the node N into the power connection hole 12a and connected to the first electrode 6a.

The six power wires 151 to 156 are respectively inserted into the different power connection holes 12b in the outer peripheral portion of the electrostatic chuck plate 10. The power wire 151 is electrically connected to the electrode portion 61 of the second electrode 6b. Likewise, the power wire 152 and the electrode portion 62 are electrically connected, the power wire 153 and the electrode portion 63 are electrically connected, the power wire 154 and the electrode portion 64 are electrically connected, the power wire 155 and the electrode portion 65 are electrically connected, and the power wire 156 and the electrode portion 66 are electrically connected.

The current regulator 51 is connected between the node N of the power wire 151 and the second electrode 6b. Likewise, the current regulators 52 to 56 are connected between the node N on the power wires 152 to 156 and the second electrode 6b, respectively.

With the circuit configuration described above, the electrode portion 61 of the second electrode 6b is electrically connected to the first electrode 6a via the power wires 151 and 157 and the current regulator 51. Likewise, the electrode portion 62 is electrically connected to the first electrode 6a via the power wires 152 and 157 and the current regulator 52. The other electrode portions 63 to 66 are also electrically connected to the first electrode 6a via the power wires 153 to 157 and the current regulators 53 to 56, respectively.

In other words, the electrostatic chuck device 1 has the power wires 151 to 157 connecting the first electrode 6a and the second electrode 6b via any one of the current regulators 51 to 56.

The power supply device 110 is connected to the node N via the power wire 150. Accordingly, electric power input from the DC power supply 113 and the high-frequency power supply 115 is supplied to the first electrode 6a via the power wires 150 and 157. Meanwhile, electric power current-controlled by the current regulators 51 to 56 is supplied via the power wires 151 to 156 to the electrode portions 61 to 66 of the second electrode 6b, respectively.

In the electrostatic chuck device 1, the thickness of the focus ring 5 decreases as the time of use increases. Then, the capacity between the metal base 11 and the plasma generation space becomes relatively large, and the high-frequency power input to the region where the focus ring 5 is disposed increases. As a result, the distribution of plasma changes, and the etching rate difference between the center and outer peripheral portions of the wafer W increases or the wear rate of the focus ring 5 increases.

In this regard, the electrostatic chuck device 1 of the present embodiment has a configuration in which the first electrode 6a positioned below the wafer W and the second electrode 6b positioned below the focus ring 5 are connected via the current regulators 51 to 56 and connected to the power supply device 110 at the node N positioned closer to the first electrode 6a side than the current regulators 51 to 56.

According to this configuration, the current flowing from the power supply device 110 to the second electrode 6b can be adjusted by the current regulators 51 to 56. Accordingly, when the current flowing through the second electrode 6b is increased due to wear of the focus ring 5, by the current regulators 51 to 56 suppressing the current, it is possible to prevent excessive high-frequency power input to the position of the focus ring 5 and maintain a satisfactory plasma distribution. According to the electrostatic chuck device 1 of the present embodiment, plasma control is possible around the focus ring 5.

Figure 3:
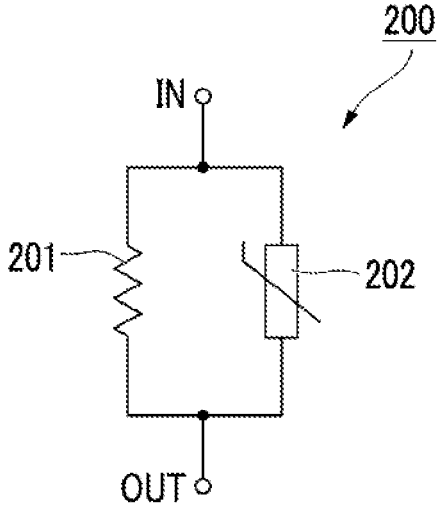
FIG. 3 is a diagram illustrating a constant current circuit applicable to a current regulator.
Figure 4:
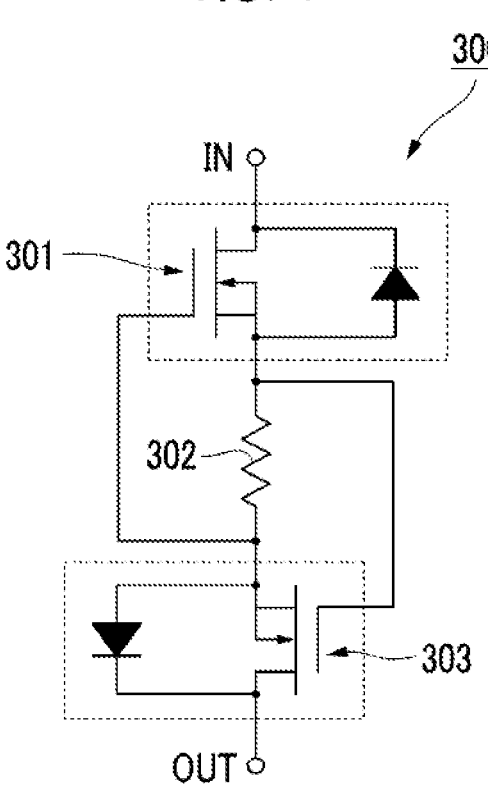
FIG. 4 is a diagram illustrating a constant current circuit applicable to the current regulator.
Figure 5:
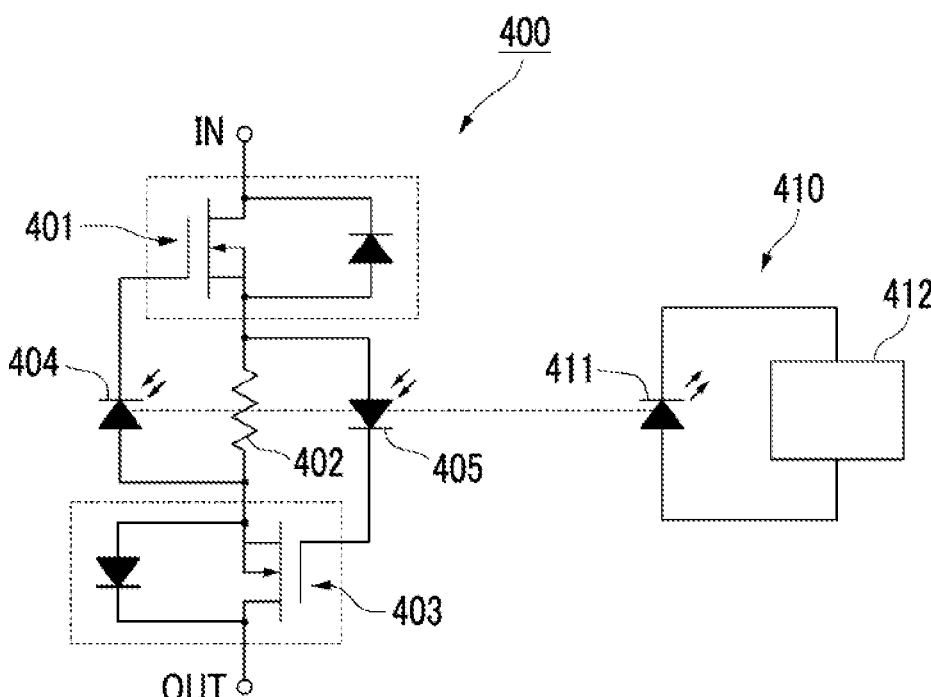
FIG. 5 is a diagram illustrating a constant current circuit applicable to the current regulator.

FIGS. 3 to 5 are diagrams illustrating constant current circuits applicable to the current regulators 51 to 56.

A constant current circuit 200 illustrated in FIG. 3 is a circuit in which a resistor 201 and a positive temperature coefficient (PTC) thermistor 202 are connected in parallel. In the constant current circuit 200, when the current flowing from an input terminal IN to an output terminal OUT increases, the PTC thermistor 202 self-heats and becomes high resistance and the current flowing through the constant current circuit 200 decreases. The amount of the current flowing through the constant current circuit 200 can be adjusted by the size of the resistor 201.

By using the constant current circuit 200 as the current regulators 51 to 56, the current flowing through the power wires 151 to 156 can be controlled within a predetermined range, and thus non-uniform plasma distribution around the focus ring 5 can be suppressed.

A constant current circuit 300 illustrated in FIG. 4 has a first transistor 301, a resistor 302, and a second transistor 303 connected in order from the input terminal IN side. Both the first transistor 301 and the second transistor 303 are N-channel depletion mode field effect transistors.

The drain of the first transistor 301 is connected to the input terminal IN. The source of the first transistor 301 is connected to the IN side terminal of the resistor 302 and the gate of the second transistor 303. The gate of the first transistor is connected to the OUT side terminal of the resistor 302 and the source of the second transistor 303. The drain of the second transistor 303 is connected to the output terminal OUT. The gate of the second transistor 303 is connected to the IN side terminal of the resistor 302 and the source of the first transistor 301.

It should be noted that the two diodes illustrated in FIG. 4 are the parasitic diodes of the first transistor 301 and the second transistor 303.

In the constant current circuit 300, the first transistor 301 is a depletion mode FET and a normally-on switch. A current input from the input terminal IN flows from the drain to the source of the first transistor 301 and flows through the resistor 302. The voltage drop of the resistor 302 is input to the gate of the first transistor 301 as a bias voltage. As a result, the gate potential of the first transistor 301 becomes lower than the source potential, and the current flowing between the drain and the source decreases to a predetermined value. It should be noted that the current input from the resistor 302 to the source of the second transistor 303 passes through the parasitic diode of the second transistor 303 and is output to the output terminal OUT.

In a case where a current from the output terminal OUT toward the input terminal IN flows through the constant current circuit 300, the current flowing through the constant current circuit 300 is adjusted by the second transistor 303. A current flowing from the resistor 302 to the first transistor 301 passes through the parasitic diode of the first transistor 301 and is output to the input terminal IN.

By using the constant current circuit 300 described above as the current regulators 51 to 56, the current flowing through the power wires 151 to 156 can be controlled within a predetermined range. Also in the configuration using the constant current circuit 300, non-uniform plasma distribution around the focus ring 5 can be suppressed.

A constant current circuit 400 illustrated in FIG. 5 has a first transistor 401, a resistor 402, and a second transistor 403 connected in order from the input terminal IN side. Further, the constant current circuit 400 has a first photodiode 404 connected between the gate of the first transistor 401 and the OUT side terminal of the resistor 402 and a second photodiode 405 connected between the gate of the second transistor and the IN side terminal of the resistor 402.

Both the first transistor 401 and the second transistor 403 are N-channel enhancement mode field effect transistors.

The drain of the first transistor 401 is connected to the input terminal IN. The source of the first transistor 401 is connected to the IN side terminal of the resistor 402 and the anode of the second photodiode 405. The gate of the first transistor is connected to the cathode of the first photodiode 404.

The source of the second transistor 403 is connected to the OUT side terminal of the resistor 402 and the anode of the first photodiode 404. The drain of the second transistor 403 is connected to the output terminal OUT. The gate of the second transistor 403 is connected to the cathode of the second photodiode 405. The anode of the second photodiode 405 is connected to the IN side terminal of the resistor 402 and the source of the first transistor 401.

It should be noted that each of the first transistor 401 and the second transistor 403 has a parasitic diode.

The constant current circuit 400 is capable of controlling the amount of current with a light source device 410 irradiating the first photodiode 404 and the second photodiode 405 with light. The light source device 410 has a light-emitting diode 411 and a control device 412 driving and controlling the light-emitting diode 411. The control device 412 is capable of controlling the brightness of the light-emitting diode 411. Light emitted from the light-emitting diode 411 is emitted to the first photodiode 404 and the second photodiode 405 via, for example, an optical fiber.

In the constant current circuit 400, the first transistor 401 is an enhancement mode FET and a normally-off switch. No current flows through the first transistor 401 in a state where the first photodiode 404 is not irradiated with light from the light source device 410.

When the first photodiode 404 is irradiated with light from the light source device 410, the cathode potential of the first photodiode 404 is input to the gate of the first transistor 401 and the first transistor 401 is turned on. As a result, the current input from the input terminal IN flows from the drain to the source of the first transistor 401 and flows through the resistor 402.

By the voltage drop of the resistor 402 being input to the gate of the first transistor 401 as a bias voltage, the gate potential of the first transistor 401 becomes lower than the source potential and the current flowing between the drain and the source reaches a predetermined value. A current input from the resistor 402 to the source of the second transistor 403 passes through the parasitic diode of the second transistor 403 and is output to the output terminal OUT.

In a case where a current from the output terminal OUT toward the input terminal IN flows through the constant current circuit 400, the current flowing through the constant current circuit 400 is adjusted by the second transistor 403 and the second photodiode 405. A current flowing from the resistor 402 to the first transistor 401 passes through the parasitic diode of the first transistor 401 and is output to the input terminal IN.

By using the constant current circuit 400 described above as the current regulators 51 to 56, the currents flowing through the power wires 151 to 156 can be controlled within a predetermined range. Also in the configuration using the constant current circuit 400, non-uniform plasma distribution around the focus ring 5 can be suppressed. Further, in the constant current circuit 400, the amount of current flowing through the constant current circuit 400 can be controlled by the amount of light emitted from the light source device 410 to the first photodiode 404 and the second photodiode 405. By using the constant current circuit 400, the plasma around the focus ring 5 can be controlled with higher accuracy.

It should be noted that although the present embodiment exemplifies the constant current circuits illustrated in FIGS. 3 to 5 as circuits applicable to the current regulators 51 to 56, the present invention is not limited to these configurations. An element capable of automatically or manually adjusting the current flowing through the power wires 151 to 156 can be used as the current regulators 51 to 56. For example, variable capacitors can also be used as the current regulators 51 to 56. By electrically or mechanically changing the capacity of the variable capacitor, the current flowing through the power wires 151 to 156 can be adjusted and plasma uniformity can be maintained on the wafer W and the focus ring 5.

The electrostatic chuck device 1 of the present embodiment has the side cover 4 surrounding the electrostatic chuck plate 10 from the outside in the radial direction, and current regulators 51 to 56 are positioned on the back surface 2b side of the dielectric substrate 2 and inside the side cover 4. Further, in the case of the present embodiment, the tubular support member 3 is disposed inside the side cover 4, and the current regulators 51 to 56 are positioned inside the support member 3.

According to this configuration, the current regulators 51 to 56 are accommodated in the internal space of the electrostatic chuck device 1, and thus the electrostatic chuck device 1 can be made compact. In addition, no components are disposed outside the electrostatic chuck device 1, and thus the electrostatic chuck device can be easily installed in existing plasma treatment apparatuses as well.

In the electrostatic chuck device 1 of the present embodiment, the constant current circuit 200 illustrated in FIG. 3 can be used for the current regulators 51 to 56. In other words, the electrostatic chuck device 1 can be configured such that the current regulators 51 to 56 include variable resistors.

According to this configuration, the current regulator can be configured using a simple circuit. The current regulators 51 to 56 can be easily reduced in size, and thus the power connection portion 50 is easily disposed on the back surface of the electrostatic chuck plate 10.

In the electrostatic chuck device 1 of the present embodiment, the constant current circuits 200, 300, and 400 illustrated in FIGS. 3 to 5 can be used for the current regulators 51 to 56. By using these constant current circuits 200, 300, and 400 in the current regulators 51 to 56, the current regulators 51 to 56 operate so as to suppress a change in current attributable to wear of the focus ring 5. As a result, the state of plasma distribution can be maintained for a long period of time.

In the electrostatic chuck device 1 of the present embodiment, as illustrated in FIG. 2, the second electrode 6b is divided into the plurality of electrode portions 61 to 66 arranged along the direction in which the focus ring extends, and the electrode portions 61 to 66 are connected to the first electrode 6a via the power wires 151 to 156, respectively. According to this configuration, the plurality of electrode portions 61 to 66 are arranged in the circumferential direction of the electrostatic chuck plate 10, the current of each of the electrode portions 61 to 66 can be controlled, and thus non-uniform plasma can be suppressed in the circumferential direction as well.

The electrostatic chuck device 1 of the present embodiment has the metal base 11 supporting the electrostatic chuck plate 10 from the back surface 2b side opposite to the placement surface 2a, and the current regulators 51 to 56 are positioned on the side of the metal base 11 opposite to the electrostatic chuck plate 10 and inside the side cover 4.

According to this configuration, the current regulators 51 to 56 can be accommodated in the internal space of the electrostatic chuck device 1, and thus the electrostatic chuck device 1 can be reduced in size. No components are disposed outside the electrostatic chuck device 1, and thus the electrostatic chuck device 1 can be easily installed in existing plasma treatment apparatuses as well.

INDUSTRIAL APPLICABILITY

According to the present invention, it is possible to provide an electrostatic chuck device capable of plasma control around a focus ring. According to the present invention, it is possible to provide an electrostatic chuck keeping a constant power balance between a substrate and a focus ring.

REFERENCE SIGNS LIST

1: Electrostatic chuck device
2: Dielectric substrate
2a: Placement surface
2b: Back surface
2c: Side end surface
2d: Ring adsorption region
3: Support member
3b: Outer peripheral surface
4: Side cover
4a: Upper end portion
4b: Notch portion
4c: Upper end surface
5: Focus ring
6: Adsorption electrode
6a: First electrode
6b: Second electrode
8: Main power supply rod
9: Heater element
10: Electrostatic chuck plate
11: Metal base
11a: Lower surface
12a: Power connection hole
12b: Power connection hole
50: Power connection portion
51, 52, 53, 54, 55, 56: Current regulator
61, 62, 63, 64, 65, 66: Electrode portion
150, 151, 152, 153, 154, 155, 156, 157: Power wire
200, 300, 400: Constant current circuit
201: Resistor
202: PTC thermistor (variable resistor)
301: First transistor
302: Resistor
303: Second transistor
401: First transistor
402: Resistor
403: Second transistor
404: First photodiode
405: Second photodiode
410: Light source device
411: Light-emitting diode
412: Control device
N: Node
W: Wafer

The invention claimed is:

1. An electrostatic chuck device, comprising:
an electrostatic chuck plate which has
   a dielectric substrate having a placement surface on which a wafer is placed and
   electrodes which are positioned in the dielectric substrate;
a focus ring which is installed on an outer peripheral portion of the electrostatic chuck plate and surrounding the placement surface; and
a power connection portion, wherein the power connection portion includes a current regulator and power wires which connect the electrodes and a power supply,
the electrodes of the electrostatic chuck plate have a first electrode which is positioned in a region overlapping the placement surface in plan view and a second electrode which is positioned in a region overlapping the focus ring in plan view, and
the power wires of the power connection portion include
   a power wire which electrically connects the first electrode and the second electrode via the current regulator, wherein the current regulator is a constant current circuit in which a first transistor, a resistor, and a second transistor are connected in this order,
a drain of the first transistor is disposed on an input terminal side,
a source of the first transistor is connected to an IN side terminal of the resistor and a gate of the second transistor,
a gate of the first transistor is connected to an OUT side terminal of the resistor and a source of the second transistor,
a drain of the second transistor is disposed on an output side, and
the gate of the second transistor is connected to the IN side terminal of the resistor and the source of the first transistor.

2. The electrostatic chuck device according to claim 1, further comprising a side cover which surrounds the electrostatic chuck plate from an outside in a radial direction,
wherein the current regulator is positioned on a back surface side of the dielectric substrate and inside the side cover.

3. The electrostatic chuck device according to claim 1, wherein the current regulator includes a variable resistor.

4. The electrostatic chuck device according to claim 1, wherein the current regulator includes a constant current circuit.

5. The electrostatic chuck device according to claim 1, wherein the second electrode is divided into a plurality of electrode portions which are arranged along a direction in which the focus ring extends, and
each of the electrode portions is connected to the first electrode via the power wire.

6. The electrostatic chuck device according to claim 1, further comprising a metal base which supports the electrostatic chuck plate from a back surface side opposite to the placement surface,
wherein the current regulator is positioned on a side of the metal base opposite to the electrostatic chuck plate and inside the side cover.

7. The electrostatic chuck device according to claim 1, wherein the first electrode is an electrode which is circular in plan view, and
the second electrode is a circular ring-shaped electrode which is divided into a plurality of parts extending along an outer peripheral portion of the dielectric substrate.

8. The electrostatic chuck device according to claim 1, wherein the second electrodes have same size and shape as each other.

9. The electrostatic chuck device according to claim 1, wherein the current regulator is a constant current circuit in which a resistor and a PTC thermistor are connected in parallel.

10. The electrostatic chuck device according to claim 1, wherein the constant current circuit has a first photodiode which is connected between the gate of the first transistor and the OUT side terminal of the resistor and a second photodiode which is connected between the gate of the second transistor and the IN side terminal of the resistor,
the source of the first transistor is connected to the IN side terminal of the resistor and an anode of the second photodiode,
the drain of the first transistor is disposed on an input side,
the gate of the first transistor is connected to a cathode of the first photodiode, the source of the second transistor is connected to the OUT side terminal of the resistor and an anode of the first photodiode, the drain of the second transistor is disposed on the output side, the gate of the second transistor is connected to a cathode of the second photodiode, and the anode of the second photodiode is connected to the IN side terminal of the resistor and the source of the first transistor.

11. The electrostatic chuck device according to claim 10, wherein the electrostatic chuck device comprises a light source device, and the constant current circuit is configured to control the amount of current with light, which is emitted from the light source device, which irradiates the first photodiode and the second photodiode with the light.

12. The electrostatic chuck device according to claim 11, wherein the light source device includes a light-emitting diode, and a control device which is configured to drive and control brightness of the light-emitting diode.

13. The electrostatic chuck device according to claim 1, wherein the power wires of the power connection portion include a power wire which electrically connects the power supply and the power wire which electrically connects the first electrode and the second electrode via the current regulator.

* * * * *